United States Patent [19]

Trevoy

[11] 4,025,342
[45] May 24, 1977

[54] ORGANIC SEMICONDUCTORS USED IN PHOTOCONDUCTOR ELEMENT

[75] Inventor: Donald J. Trevoy, Fairport, N.Y.

[73] Assignee: Eastman Kodak Company, Rochester, N.Y.

[22] Filed: Feb. 2, 1976

[21] Appl. No.: 654,440

Related U.S. Application Data

[60] Division of Ser. No. 482,960, June 25, 1974, Pat. No. 3,963,498, which is a continuation-in-part of Ser. No. 212,640, Dec. 27, 1971, abandoned, and Ser. No. 455,705, March 28, 1974, abandoned.

[52] U.S. Cl. .................................. 96/1.5; 96/1 R; 96/67; 96/87 A; 428/411
[51] Int. Cl.$^2$ .......................................... G03G 5/04
[58] Field of Search .............. 96/1.5, 1 R, 67, 87 R, 96/87 A, 114.2; 252/501; 260/47 C, 47 XA, 49, 59 R, 75 T; 526/9, 13, 16; 428/411

[56] References Cited

UNITED STATES PATENTS

| 3,245,833 | 4/1966 | Trevay | 96/87 A |
| 3,525,621 | 8/1970 | Miller | 96/85 |
| 3,591,379 | 7/1971 | Plakunov | 96/50 |
| 3,856,530 | 12/1974 | Vanpaesschen et al. | 96/87 A |

OTHER PUBLICATIONS

Surville et al., Electrochemica Acta, vol. 13, pp. 1451–1458 (1968).
Yu et al., Revue Generale de Electricite, 9, pp. 1014–1018 (1966).
Jozfowicz et al., Journal of Polymer Science, Part C, vol. 16, pp. 2913–2924 (1967).

*Primary Examiner*—Jack P. Brammer
*Attorney, Agent, or Firm*—R. P. Hilst

[57] ABSTRACT

The amine salts of linear polyaniline compounds, including substituted polyaniline compounds, are useful semiconductors. These materials are generally soluble in popular organic solvents and have resistivities between $10^{-3}$ and $10^9$ ohm-cm. These compounds are useful in the formation of semiconductor compositions, including self-supporting films, and various semiconductor elements such as antistatic films and fibers.

5 Claims, No Drawings

ORGANIC SEMICONDUCTORS USED IN PHOTOCONDUCTOR ELEMENT

This is a division of U.S. Ser. No. 482,960, filed June 25, 1974 now U.S. Pat. No. 3,963,498 which in turn is a continuation-in-part application based on Ser. No. 212,640, filed Dec. 27, 1971 and Ser. No. 455,705, filed Mar. 28, 1974 both of which are now abandoned.

This invention relates to new organic semiconductors and to compositions and elements containing these materials.

The usefulness of semiconducting organic materials is often associated with a combination of desirable properties, e.g., (1) electronic properties such as low electrical resistivity, (2) chemical properties like low relativity and (3) physical properties which facilitate convenient preparation of useful articles of manufacture. A number of inorganic materials well known in the art, such as metals (e.g., silver, copper) or semiconductors (e.g., germanium, silicon) have useful electrical properties. However, because it is possible to introduce and modify their physical and chemical properties such as solubility, melting point, etc., by relatively minor changes in the chemical structure of the organic molecules, organic semiconductors have a distinct advantage over inorganic materials. As a result, organic semiconductors can be tailor-made to display multiple useful properties not found in inorganic substances.

The preparation of organic materials showing appreciable electrical conductivity has been the subject of several publications and reviews [(see, for example, Y. Okamoto and W. Brenner, "Organic Semiconductors", Reinhold Publishing Corp., New York (1964); F. Gutmann and L. F. Lyons, "Organic Semiconductors", John Wiley and Sons, Inc., New York (1967); and J. E. Katon, "Organic Semiconducting Polymers", Marcel Dekker, Inc., New York (1968)]. They may be classified in four broad groups:

1. Non-complex organic semiconductors, consisting of single monomeric species. (The term "semiconductor" as used herein describes electrically conducting materials with a resistivity in the range of $10^{-3}$ to $10^9$ ohm-cm).

2. Complex organic semiconductors, consisting in general of at least two monomeric species (comprising an electron donor moiety and an electron acceptor moiety, respectively) associated to a certain extent through charge transfer.

3. Non-complex polymeric organic semiconductors.

4. Complex organic semiconductors where at least one of the electron donor moieties or the electron acceptor moieties is attached to, or part of, a polymeric chain. Most of the known organic semiconductors, showing resistivity values lower than $10^4$ ohm-cm, belong to the second and fourth categories, but many of these are unstable under ambient conditions, hence reducing their usefulness considerably. Furthermore, those which show reasonable stability are usually obtained in the form of insoluble, infusible powders, which, in general, are not amenable to fabrication into useful articles of manufacture.

In recent publications [e.g., Y. Matsunaga, *J. Chem. Phys.* 42, 2248 (1965) and Y. Okamoto, S. Shah, and Y. Matsunaga, *J. Chem. Phys.*, 43, 1904 (1965)] new organic semiconductors of low resistivity have been described in which a sulfur-containing polycyclic hydrocarbon (tetrathiotetracene) acts as the electron donor in dative-type change transfer complexes with any one of three organic acceptors: o-chloranil, o-bromanil or tetracyanoethylene. (The term "dative-type charge transfer complex" describes a charge transfer complex between an electron donor and an electron acceptor in which the constituents are in an ionized form in the ground state of the complex. These complexes may also be designated by the term "ion-radical salts", the electron donor becoming the "cation-radical" and the acceptor becoming the "anion-radical".) The described complexes, however, lack solubility in organic solvents as well as in water. Likewise, tetrathiotetracene itself, although showing one of the lower electrical resistivities of the non-complex organic semiconductors reported (resistivity of the compressed powder is of the order of $10^4$ ohm-cm), is only very slightly soluble at room temperature in a few very strong organic solvents. None of the aforementioned organic semiconductors has sufficient solubility to permit ready fabrication of coatings, films, fibers, etc, utilizing such materials.

It is, therefore, an object of this invention to provide a novel class of organic semiconductors.

It is a further object to provide compositions containing the novel organic semiconductors described herein and processes for preparing such compositions.

It is still a further object of this invention to provide elements containing the novel organic semiconductors and semiconductor compositions described herein.

These and other objects and advantages are accomplished using certain amine salts of linear polyaniline and substituted linear polyaniline compounds, which salts are useful semiconductors. These amine salts are formed by the interaction of certain organic amines (i.e. organic compounds containing primary amine, secondary amine and tertiary amine groups, as well as compounds containing groups derived from amine groups, such as imine groups) with suitable inorganic or organic acids. The starting amines are typically insulators or at best, low conductivity semiconductors. The resultant amine salts are, however, highly conducting semiconductors. The resistivity of the present materials is in the range of $10^{-3}$ to $10^9$ ohm-cm and is substantially independent of humidity.

Although, in general, salts formed by the action of an organic amine and an acid are known in the art, most of these materials are not semiconductors. For example, such amine salts as Rosaniline hydrochloride, Malachite Green, Pararosaniline hydrochloride, Auramine O and Methylene Violet all exhibit insulating properties (i.e., resistivity values $> 10^9$ ohm-cm) when tested in a vacuum and in the absence of moisture. L. T. Yu et al, *Compt Rend*, 260, 5026 (1965), reported high conductivity for emeraldine sulfate when it contained excess sulfuric acid and/or water. However, the material was a microscrystalline powder insoluble in useful solvents and hence, lacking utility as a constituent of practical conducting coatings. Additional publications by Dr. Yen and others that discuss such insoluble and humidity dependent polyaniline semiconductors as emeraldine sulfate are *Compt Rend*, 258, 6421 (1964); *Compt Rend*, 262, 459, (1966); *Revue Generale de Electricite*, 9, 1014 (1966); *Journal of Polymer Science: Part C*, 16, 2931 and 2943 (1967); Electrochemica Acta, 13, 1451 (1968); *Compt Rend*, 269, 964 (1969); *Journal of Polymer Science*, 22, 1187 (1969); and *Journal Chem. Phys*, 68, 1055 (1971).

The present state of the art does not broadly assist one is predicting semiconductive properties of organic solids merely from structural considerations. However, I have found a specific class of organic amine salts which not only have good semiconductive properties substantially independent of humidity, but which are stable and which are sufficiently soluble in solvents including typical organic solvents to form either alone or in combination with a co-dissolvable binder material, liquid solutions that are substantially optically clear and which do not scatter light between 400 nm and 700 nm. Such solutions can be prepared conveniently, thereby facilitating the ready formation of stable semiconductor compositions and elements.

The organic semiconductors useful in this invention are described by the following expression:

I. $D[A]_q$ wherein:

D is a moiety which can be represented by the structure:

II.

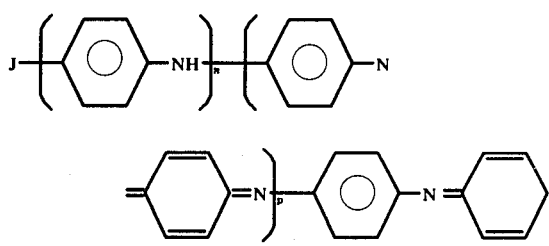

in which:

J represents either $R_1$ or a group having the formula

K represents either $R_3$ or a group having the formula

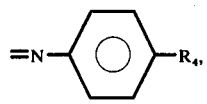

$R_1$ and $R_4$ may be the same or different, and are selected from the groups consisting of hydrogen; hydroxy; lower alkyl having from 1 to 8 carbon atoms such as methyl, ethyl, isopropyl, butyl, etc; lower alkoxy having from 1 to about 8 carbon atoms in the alkyl moiety such as methoxy, ethoxy, propoxy, butoxy, etc; amino, including substituted amino radicals such as alkyl- and dialkylamino radicals having from 1 to about 8 carbon atoms in each alkyl moiety and acylamino radicals such as acetylamino, benzoylamino, naphthoylamino, etc; aryl such as phenyl, naphthyl, including substituted aryl radicals such as tolyl, acyl such as acetyl, benzoyl, naphthoyl, etc; thio, nitrate; carboxylate; sulfonate; halogen; and cyano radicals;

$R_2$ and $R_3$ each represent (1) an uncharged (i.e., non-ionized) radical selected from an oxo radical (=O); an imino radical (=NH) including alkyl-substituted imino radicals having from 1 to 8 carbon atoms in the alkyl substituent, aryl-substituted imino radicals such as phenylimino, naphthylimino and acyl-substituted imino radicals such as acetylimino, benzoylimino; and a thioxo radical (=S) or (2) a charged (i.e., ionized) radical selected from an alkoxonium radical (=R$^+$, where R is alkyl) having from 1 to about 8 carbon atoms in the alkyl moiety; an iminium radicals having from 1 to about 8 carbon atoms in each alkyl moiety; and a sulfonium radical (=SH$^+$);

$n$ and $p$ are each integers having the following combinations of values:

| When J represents 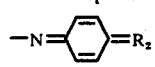 and K represents $R_3$, | $p = 0$ $n = 0, 1, 2, 3, 4, 5$ |
| --- | --- |
| | $p = 1$ $n = 0, 1, 2, 3$ |
| | $p = 2$ $n = 0, 1$ |
| when J represents $R_1$ and K represents $R_3$, | $p = 0$ $n = 0, 1, 2, 3, 4, 5, 6$ |
| | $p = 1$ $n = 0, 1, 2, 3, 4$ |
| | $p = 2$ $n = 0, 1, 2$ |
| | $p = 3$ $n = 0$ |
| when J represents $R_1$ and K represents 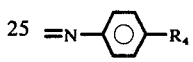 | $p = 0$ $n = 0, 1, 2, 3, 4, 5$ |
| | $p = 1$ $n = 0, 1, 2, 3$ |
| | $p = 2$ $n = 0, 1$; |

A is a monomeric or polymeric moiety such that when $R_2$ and $R_3$ are each an uncharged radical, A is an acid and when $R_2$ and/or $R_3$ is a charged radical, A is an anion derived from an acid.

In any semiconductor described herein, however, the value of $q$ for each D will not be greater than the number of amine groups included within the D moiety. Stated in summary, $q$ is a positive integral number that is greater than 0 and less than or equal to the number of amine groups in the D moiety. It will be understood that the term amine group herein means and refers to primary, secondary and tertiary amine groups as well as groups derived from amine groups, such as imine groups.

Based on optical examination and knowledge of their semiconducting properties, it is believed that the amine salt semiconductors of this invention have, as is the case with crystalline materials, an ordered configuration of units (e.g. moieties as represented by D and A). Referring to Table II below it should be emphasized that in any sample of the semiconductors described herein wherein a plurality of semiconductor molecules (i.e. as represented by the foregoing formulas) are present, and hence a plurality of D moieties, the average association of A moieties with D moieties can be nonstoichiometric within the range described for $q$. As a result, analysis of a sample for association between A and D moieties can indicate that the average value of $q$ is a positive, integral or non integral number of from greater than zero to less than or equal to the number of amine groups in the largest D moiety present in the sample under analysis.

A particularly useful group of linear moieties having 2 to 5 rings is represented by the formula II above wherein $a$, $m$, $n$, $p$, $x$ and $y$ have the following combinations of values:

| $a = 0, m = 1, x = 1, y = 0$ | $p = 0$ | $n = 0, 1, 2, 3$ |
| --- | --- | --- |

-continued

| | | |
|---|---|---|
| a = 1, m = 0, x = 1, y = 0 | p = 0 | n = 0, 1, 2 |
| | p = 1 | n = 0, 1 |
| a = 1, m = 0, x = 0, y = 1 | p = 0 | n = 0, 1, 2 |
| | p = 1 | n = 0 |

It should be emphasized that, for those semiconductors represented by formula II, and described in the preceding paragraph, it was extremely unexpected and not predictable that they would exhibit both desirable solubility in organic solvents and useful conductivity. The shorter chain lengths, although they might enhance solubility, would also decrease total conjugation and restrict electron delocalization to a degree thought perhaps insufficient for the occurrence of conductivity within the range set forth herein.

It should be noted that both terminal groups shown on the right hand portion of formula II are divalent radicals and only one is present at a time. For simplicity, these divalent radicals are shown as being attached with a soild and a broken line.

Moieties represented by Formula II above can be derived from a broad variety of organic amines. In general, such amines are not in the completely reduced or leuco form and contain at least one quinoid ring represented by the structure:

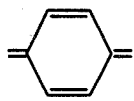

III

Although there can be more than one quinoid ring in the amine portion of the salt, the number of quinoid rings in the D moiety will not in any case exceed by more than one, one-half of the total number of rings. Presence of quinoid ring structures gives rise to conjunction between rings in the structure and is thought to provide electron delocalization that is desirable in organic semiconductor compounds. Formula II above is thus merely a convenient way of representing the compounds of the invention and is not meant to indicate which rings are always aromatic and which are of the quinoid type. Although particular rings are not necessarily always aromatic or always quinoidal, there is always para-coupling of all anilino, substituted anilino, quinoid, or substituted quinoid moieties contained within the instant compounds.

Of course, any of the para-coupled rings of the amine portion can be substituted at the ortho- or meta-positions of the ring. Suitable substituents would include a hydroxy radical; an alkyl radical, including substituted alkyl radicals having from 1 to 6 carbon atoms such as methyl, ethyl, isopropyl, tert-butyl, etc; an alkoxy radical including substituted alkoxy radicals having from 1 to about 6 carbon atoms in the alkyl moiety; an acyl radical, including substituted acyl radicals; an aryl radical, including substituted aryl radicals, such as phenyl, tolyl, naphthyl, etc; and other radicals such as aroxyl, sulfo, carboxyl, amino, including alkylamino and arylamino, nitro, a halogen radical, cyano, etc.

Within the broad range of acids useful in preparing amine salt compounds described herein, one can select an acid that will provide or enhance solubility of the resultant amine salt semiconductor in a solvent of choice. Preferably, the amine salt semiconductors described herein have organic solvent solubility, i.e., form a substantially optically clear liquid organic solvent solution that does not scatter visible light. Although the particular acid will affect electrical properties of the amine salt, there are so many acids that one skilled in the art and having an understanding of this invention can select an acid that provides both desired solubility and desired conductivity. It is extremely desirable that such a tailoring of solubility and conductivity can be accomplished.

It should be emphasized also that, in cases where the A moiety is polymeric (derived from a polymeric acid) the amine salt semiconductor is a very advantageous polymer that conducts electricity within the range specified herein. Although there are known electrically conducting polymers, such as the TCNQ charge transfer compounds described in U.S. Pat. No. 3,162,641, polymers of the type described herein are highly soluble in popular solvents, chemically stable at high humidity and desirably electrically conductive even under extremely low humidity (e.g., at high altitude, under vacuum and under other low humidity environments).

In general, the compounds of this invention are prepared by the interaction of a suitable amine with a monomeric or polymeric acid. Mixtures of compatible amines and acids can be used, if desired. The parent amine compound is suitably oxidized to an oxidation state higher than the leuco or lowest oxidation state. The oxidized amine is then interacted with an acidic compound in a solvent such as an ether (e.g., tetrahydrofuran, ethyl ether, isopropyl ether, etc), a ketone (e.g., acetone, etc,), an alcohol (e.g., methanol, ethanol, n-propanol, isopropanol, etc), an aromatic solvent (e.g., benzene, toluene, etc), or water, or in mixtures of these or other solvents. When the resulting amine salt has substantial solubility in the solvent or solvent mixture employed, isolation of the solid is accomplished by using concentrations which exceed the solubility limit of the amine salt in the solvent or solvent mixture of choice. The precipitate is then filtered and washed. Procedures of this type are described, for example, by A. G. Green et al, *J. Chem. Soc.*, 97, 2392 (1910), R. Willstatter et al, *Chem. Ber.*, 40, 2677 (1907).

Amines useful in preparing the present semiconductor compounds according to such representative procedures include the illustrative compounds set forth in Table I.

TABLE I

1 N-(p-anilinophenyl)-1,4-benzoquinone imine
2 N-[p-(4-anilino)anilinophenyl]-1,4-benzoquinone imine
3 N-(p-anilinophenyl)-N'-(p-aminophenyl)-1,4-benzoquinone diimine
4 N-[p-(1,4-benzoquinone diimino)phenyl]-N'-phenyl-1,4-benzoquinone diimine
5 N-[p-(4-aminoanilino)phenyl]-N'-(p-aminophenyl)-1,4-benzoquinone diimine
6 N-{p-[4-(p-anilino)anilino]anilinophenyl}-N'-p-[N-(p-aminophenyl)-1,4-benzoquinone diimino]-phenyl-1,4-benzoquinone diimine
7 N-(p-dimethylamino)phenyl-1,4-benzoquinone diimine
8 N-[p-(1,4-benzoquinone diimino)phenyl]-1,4-benzoquinone diimine
9 N,N'-diphenyl-1,4-benzoquinone diimine
10 N-[p-(4-aminoanilino)phenyl]-1,4-benzoquinone imine 11 N-[p-(4-hydroxyanilino)phenyl]-1,4-benzoquinone imine 12 N-{p-[4-81,4-benzoquinone imino)anilino]phenyl}-1,4-benzoquinone imine 13 N-[p-(4-dimethylaminoanilino)phenyl]-1,4-benzoquinone imine 14 N-[p-(4-anilino)anilinophenyl]-N'-acetyl-1,4-benzoquinone diimine 15 N-{p-[4-(p-methoxyanilino)anilino]phenyl}-1,4-benzoquinone imine 16 N-(p-anilinophenyl)-N'-[p-(4-aminoanilino)-phenyl]-1,4-benzoquinone diimine 17 N-(p-anilinophenyl)-N'-[p-(1,4-benzoquinone imino)-phenyl]-1,4-benzoquinone diimine The following are representative of the numerous acids which can be used to prepare the present semiconductor compounds. Useful inorganic acids would include such materials as haloid acids, e.g., hydrogen chloride, hydrogen bromide, hydrogen fluoride, hydrogen iodide, fluoboric acid, etc; sulfur acids such as sulfurous acid, sulfuric acid, thiosulfuric acid, thiocyanic acid, etc; acids of phosphorous such as phosphorous acid, phosphoric acid, etc; nitrogen acids such as nitrous acid, nitric acid, etc; and the like. Useful organic acids would include various mono-, di- and polyfunctional organic acids such as aliphatic acids, both saturated and unsaturated having from 1 to about 8 carbon atoms, for example, formic, acetic, propionic, maleic, fumaric, butynedioic, oxalic, succinic, adipic acid, acetylene-dicarboxylic acid; aromatic acids such as phthalic, terephthalic, benzoic, toluic, p-toluenesulfonic acid, naphthoic acid; and organic compounds containing acidic hydrogen atoms such as barbituric acid and 2-thiobarbituric acid. In addition to the monomeric inorganic and organic acids described above, various acidic polymers can be used. Any polymer containing an acidic function, such as carboxy or sulfo, or containing a sufficiently acidic hydrogen atom, as in certain polyhydroxy substituents, would be useful in providing semiconducting polymers according to this invention. Useful polymers would include vinyl polymers containing acid functionality, for example: (a) poly(acid) polymers such as poly(acrylic acid), poly(methacrylic acid), etc; (b) copolymers of esters and acids such as poly(methyl methacrylatemethacrylic acid), poly(butyl methacrylate-methacrylic acid), poly(vinyl acetate-maleic acid), etc; (c) copolymers of an ether and acid or anhydride such as poly(vinyl methyl ether-maleic anhydride), etc; (d) copolymers of olefin and acid such as poly(ethylene-maleic acid), etc: (e) other copolymers (including terpolymers and quaterpolymers, etc) containing acidic functionality as described above; (f) polymers containing the sulfo groups such as sulfonated poly(styrene), etc; (g) copolymers, terpolymers quaterpolymers, etc, containing the sulfo group, etc. Classes of polymers other than vinyl polymers, such as natural resins, cellulosics, polycondensates, silicones, alkyd resins, polyamides, etc, would also be useful provided they contain acid functionality imparted by the presence of carboxy or sulfo groups or by the presence of acidic hydrogen atoms. Particularly useful polymers are poly(acrylic acid) and poly(ethylene-maleic acid).

The moiety A can also be provided partially or totally by the metal salt derived of an acid, e.g., zinc chloride. For example, a semiconducting amine salt has been prepared in which the moiety A as indicated by elemental analysis comprises ½ mole of zinc chloride in conjunction with 3½ moles of hydrochloric acid. The conductivity of this compound is substantially independent of relative humidity, and the salt is electrically conductive in high vacuum.

Particular useful amine salt semiconductor compounds include those formed from one of sulfuric acid, hydrobromic acid, fluoboric acid, benzoic acid or p-toluene sulfonic acid together with one of N-{p-[4-(p-methoxy anilino)anilino]phenyl} 1,4-benzoquinone imine, N-[p-(1,4-benzoquinone diimino)phenyl]-N'-phenyl-1,4-benzoquinone diimine, N-(p-anilinophenyl)-N'-(p-aminophenyl)-1,4-benzoquinone diimine, and N-[p-(4anilino)-anilinophenyl]-1,4-benzoquinone imine. Other especially useful semiconductors include polymeric amine salts such as N-(p-anilinophenyl)-N'-(p-aminophenyl)-1,4-benzoquinone and N-(p-anilinophenyl)-N'-(p-aminophenyl)-1,4-benzoquinone.

The amine salt semiconductor compounds described herein can be used to prepare useful semiconductor compositions. Such compositions can include at least one of the present semiconductor compounds in combination with, i.e., in the presence of, at least one binder material. In one aspect, the semiconductor compositions of this invention can have a semiconductor and a binder together in a liquid solution, such as an organic solvent solution. The compositions can be prepared conveniently by dispersing or dissolving one or more semiconductors in a liquid solution of binder material.

It will be appreciated that, for photographic purposes and the like, substantially optically clear solutions that can be coated to form layers that do not scatter visible light (e.g. from 400 to 700 nm) are preferred. For other purposes, solutions not having optical clarity or dispersions are suitable. Preferred binders are generally film-forming polymeric materials. Typical such polymers include I. Natural resins including gelatin, cellulose ester derivatives such as alkyl esters of carboxylated cellulose, hydroxy ethyl cellulose, carboxy methyl cellulose, carboxy methyl hydroxy ethyl cellulose, etc;

II. Vinyl resins including a. polyvinyl esters such as a vinyl acetate resin, a copolymer of vinyl acetate and crotonic acid, a copolymer of vinyl acetate with an ester of vinyl alcohol and a higher aliphatic carboxylic acid such as lauric acid or stearic acid, polyvinyl stearate, a copolymer of vinyl acetate and maleic acid, a poly(vinylhaloarylate) such as poly(vinyl-m-bromobenzoate), a terpolymer of vinyl butyral with vinyl alcohol and vinyl acetate a terpolymer of vinyl formal with vinyl alcohol and vinyl acetate, etc;

b. vinyl chloride and vinylidene chloride polymers such as a poly(vinyl chloride), a copolymer of vinyl chloride and vinyl isobutyl ether, a copolymer of vinylidene chloride and acrylonitrile, a terpolymer of vinyl chloride, vinyl acetate and vinyl alcohol, poly(vinylidene chloride) a terpolymer of vinyl chloride, vinyl acetate and maleic anhydride, a copolyer of vinyl chloride and vinyl acetate, etc;

c. styrene polymers such as a polystyrene, a nitrated polystyrene, a copolymer of styrene and monoisobutyl maleate, a copolymer of styrene with methacrylic acid, a copolymer of styrene and butadiene, a copolymer of dimethylitaconate and styrene, polymethylstyrene, etc;

d. methacrylic acid ester polymers such as a poly(alkylmethacrylate), etc;

e. polyolefins such as chlorinated polyethylene, chlorinated polypropylene, etc;

f. poly(vinyl acetals) such as a poly(vinyl butyral), etc; and g. poly(vinyl alcohol);

III. Polycondensates including a. a polyester of 1,3-disulfobenzene and 2,2-bis(4-hydroxyphenyl)propane;

b. a polyester of diphenyl-p,p'-disulfonic acid and 2,2-bis(4-hydroxyphenyl)propane;

c. a polyester of 4,4'-dicarboxyphenyl ether and 2,2-bis(4-hydroxyphenyl)propane;

d. a polyester of 2,2-bis(4-hydroxyphenyl)propane and fumaric acid;

e. pentaerythrite phthalate;

f. resinous terpene polybasic acid;

g. a polyester of phosphoric acid and hydroquinone;

h. polyphosphites;

i. polyester of neopentylglycol and isophthalic acid;

j. polycarbonates including polythiocarbonates such as the polycarbonate of 2,2-bis(4-hydroxyphenyl)propane;

k. polyester of isophthalic acid, 2,2bis-4-($\beta$-hydroxyethoxy)phenylpropane and ethylene glycol;

l. polyester of terephthalic acid, 2,2bis-4-($\beta$-hydoxyethyoxy)phenyl and ethylene glycol;

m. polyester of ethylene glycol, neopentyl glycol, terephthalic acid and isophthalic acid;

n. polyamides;

o. ketone resins; and p. phenolformaldehyde resins;

IV. Silicone resins; and

V. Alkyd resins including styrene-alkyd resins, silicone-alkyd resins, soya-alkyd resins, etc.

Solvents of choice for preparing semiconductor compositions of the present invention can include a number of solvents preferably organic solvents such as alcohols including aliphatic alcohols preferably having 1 to 8 carbon atoms including methanol, ethanol, propanol, isopropanol, etc, aromatic alcohols, polyhydric alcohols, substituted alcohols, including 2-methoxyethanol, ketones including aliphatic ketones such as acetone, 2-butanone, methyl isobutyl ketone, etc, aromatic ketones including cyclohexanone, etc, chlorinated solvents including aliphatic chlorinated solvents such as methylene chloride, ethylene chloride, propylene chloride, etc, organic caboxylic acid having 1 to 10 carbon atoms such as formic, acetic, propionic, etc, substituted carboxylic acids, including esters derived from organic carboxylic acids having 1 to 10 carbon atoms such as methyl acetate, ethyl acetate, etc, lower dialkylsulfoxides such as dimethylsulfoxide, dimethylformamide, acetonitrile, and water. Also included are mixtures of these solvents among themselves or with other organic solvents.

In preparing the compositions useful results are obtained where the semiconductor is present in an amount equal to at least about 1 weight percent of the total composition. The upper limit in the amount of semiconductor present can be widely varied in accordance with usual practice. In those cases where a binder is employed, it is normally required that the semiconductor be present in an amount from about 1 weight percent of the coating to about 99 weight percent of the coating. A preferred weight range for the semiconductor in binder containing compositions is from about 10 weight percent to about 60 weight percent.

Semiconductor elements, i.e., elements having an amine salt semiconductor in combination with a support can be prepared, for example, by applying a semiconductor or semiconductor composition on a supporting substrate. In one embodiment, the semiconductor elements can include a support having thereon a coated layer that includes a semiconductor as described herein and, optionally, a binder. Suitable supports which are also conventionally termed supporting substrates, are broadly variable and the choice in any instance will depend on the intended application. Polymeric films, such as those useful in photography, as well as glass, paper (including papers coated with water resistant resins) and metals are representative of desirable support materials. It is emphasized, also, that support geometry is not limited, and will vary depending on the intended use for the element. Fibers, including synthetic polymer fibers useful for weaving into cloth, can constitute supporting substrates for semiconductor elements. Also, spheres or other geometrical configurations can be useful supports and can be made up of any material that is chemically and physically compatible with the semiconductor compositions. In this regard, a support can carry a subbing layer to promote adhesion of the semiconductor composition.

When coating a semiconductor composition on a support, the thickness of the layer can be controlled if desired, by using such techniques as doctor blade coating or extrusion hopper coating. Generally, a wet coating thickness of about 0.0001 inch to about 0.01 inch in preferable, with a wet coating thickness of about 0.0002 inch to about 0.001 inch usually being most perferable. Useful results can be obtained outside of this range and layers including the semiconductor might be either thicker or thinner, for example if spray coating, fluidized bed coating, dip coating or other coating techniques are used. Evaporation of the coating solvent, optionally accelerated by drying under an environment of controlled temperature and/or humidity, produced a durable layer in which the semiconductor is contained. Although not intending to be bound by theory, it is believed that the semiconductor is present in the layer as a dispersion of microcrystals, even if initially dissolved in the coating solution.

It should be emphasized that, in instances where the support will accept and retain amine salt semiconductor, whether by absorption, imbibition, or otherwise, semiconductor elements wherein a support has thereon a binderless semiconductor layer can be prepared by treating such a support material with a solution of the semiconductor. Alternatively, the semiconductor layer can be formed in situ on the semiconductor element, using various techniques. For example, a coating composition containing either an amine or an acid useful in preparing an amine salt semiconductor, and optionally a binder material, can be applied to a support and dried. Thereafter, the treated support can be treated with the component not included in the coating composition. Typically, this treatment will use a liquid solution of vapors of the active component. Normal care would be taken to insure that the treatment did not impare the integrity of the previously coated layer. In one preferred embodiment, a polymeric acid can be coated from a solvent, optionally with additional binder material, to prepare a layer that is subsequently overcoated with a solution of an amine (compounds including primary amine, secondary amine and tertiary amine groups as well as compounds including groups derived from amines, such as imine groups).

In situations where either the binder is used in a semiconductor composition or a polymeric amine salt as described herein have a sufficient film-forming capability, the composition can be formed as a self-supporting solid or plastic film. In such cases, a separate support is not required, and the resulting continuous film is a semiconducting material. Some such self-supporting films can be prepared using coating techniques such as those described herein. Generally, the coating would be applied to a nonadherent surface and then physically stripped from the surface after evaporation of the solvent from the coating composition. In other instances, it may be desirable to prepare a semiconductor composition (or coating composition(s) containing the amine and/or acid) that can be extruded to produce a self-supporting semiconductor composition) as a film or filament, in the case of fibers.

In certain applications, it may be desirable to have a semiconductor element include a protective layer, usually adjacent to the semiconductor. Such protective layers may be used for a variety of reasons, for example to protect the semiconductor, which may be in a separate layer, from abrasion or attack by solvents or other chemicals. Alternatively, the protective layer may be used to protect the semiconductor and/or other constituents in the element from undesired chemical or electronic interaction, such as by preventing electrical conduction or diffusion of the semiconductor and/or other constituents between various regions of the elements. The protective layer is usually a film forming polymer that can be applied using coating techniques such as those described elsewhere herein. Desirable materials include polymers or copolymers of vinlidene chloride including copolymers containing substantial amounts of vinylidene chloride with acrylic monomers such as acrylonitrile, methyl acrylate, and the like. Such preferred polymers are described in U.S. Pat. Nos. 2,627,088, 2,491,023, 2,779,684, 3,437,484, 3,271,345, 3,143,421, 2,943,937 and 2,999,782. However, other suitable resins for making the protective layer are resins of cellulose acetate, cellulose acetate-butyrate, cellulose nitrate, polyvinyl butyral, polymethyl methacrylate, polyvinyl chloride, polystyrene, polyesters, polycarbonates, and the like. In certain situations, it may be desirable to have the protective layer be electrically insulating or substantially optically transparent, or both. Preferred materials, if this is the case, can easily be determined.

Semiconductor elements as described herein can be used either as, or in, a variety of articles of manufacture. Importantly, semiconductor compositions in the form of self-supporting, conducting films or semiconductor elements in which an electrically insulating support is coated with an amine salt semiconductor can be used in electronics components such as resistors, capacitors, rectifiers, transistors, etc. Also, such compositions and elements can be used as an antistatic support material for magnetic recording tapes.

In another aspect, semiconductor compositions and elements in which the semiconductor layer and the support (or self-supporting conducting film) are not more than about 0.5 optical density between about 400 to 800 nm. are particularly useful when substantially optically transparent conducting materials are desired. Such materials can be used as static inhibiting photographic film support, as conducting windows in electronic instruments, as anti-static camera lenses or the like.

When semiconductor compositions and elements as described herein are extruded or otherwise formed as filaments, electrically conducting fibers are prepared. Using such fibers permits weaving fabric that resists generating static electricity on frictional contact. Alternatively, a filamentary semiconductor composition or element can be used as a core and overcoated with other materials (e.g. polymers) to prepare composite conducting fibers suitable for weaving into cloth.

Semiconductor elements as described herein can be coated with light-sensitive materials to prepare semiconductor elements that are also image-forming elements. In one aspect, a semiconductor element having thereon a layer comprising an amine salt semiconductor can be coated with a silver halide photographic emulsion of the type used to record electron beam radiation. Desirably, the semiconductor layer and silver halide layer are contiguous to each other, and either can be contiguous to the support. As may be desirable with many types of photographic elements, the support may carry a subbing layer to improve adhesion of subsequently coated layers. Protective layers as described herein can be included as interlayers or overcoats, if desired. Other silver halide emulsions can be applied to semiconductor compositions or elements, as by the coating techniques described previously, to prepare light-sensitive photographic elements that inhibit the formation of static electricity. It may be desirable to interpose an electrically insulating layer between the semiconductor and the silver halide. This can be accomplished by having a semiconductor and silver halide coated on opposite sides of an electrically insulating support or by interposing an electrically insulating layer, usually a clear polymer, between the two if the silver halide is coated on a conducting surface of the semiconductor composition or element. It will be appreciated that, for optimal photographic use, the support and any protective (e.g. insulating) layers may preferably be clear, i.e., substantially optically transparent. If the back (nonemulsion) surface of a silver halide coated semiconductor element bears the semiconductor, and if in winding the element on itself or positioning several elements in a front to back relationship this surface may contact the silver halide, then it may be desirable to overcoat the semiconductor with a protective layer of polymeric or other insulating material. This, of course, could also serve as an abrasion resistant layer.

In still another embodiment, semiconductor elements of this invention can be coated with an organic or inorganic photoconductive material to prepare electrophotographic elements. The photoconductor is usually applied contiguous to a conducting surface of the semiconductor element. However, electrically insulating protective layers, preferably thin, can be coated either under the semiconductor and the photoconductor, between the two or over both.

Another use for the present amine salt semiconductors is in preparing conducting particles useful as toners in electrophotographic development. Generally, such toners are fine powders that have an electrically insulating core bearing a low resistance outer shell. Such toners are described, for example, in patents such as U.S. Pat. No. 2,976,144 and U.S. Pat. No. 3,099,041. By using core constituents as the support and overcoating such support with an amine salt semiconductor or semiconductor composition, according to techniques described herein, useful conducting toners can be prepared. Conducting toners are generally desirable when induction toning techniques are used to develop an electrostatic image.

Other embodiments are also useful. For example, when the photoconductor composition is amenable to fabrication by molding techniques, electrically conducting molded articles can be prepared.

The following examples are included for a further understanding of the invention.

EXAMPLE 1

The amine 3 of Table I is prepared by the method of A. G. Green et al (supra). A solution containing 0.5 g. of this amine in 250 ml. of ether is filtered into a stirred solution containing 1.2 g. of maleic acid in 100 ml. of ether. A blue-green precipitate forms and is separated by filtration, washed with 50 ml. of ether and dried at room temperature. The volume resistivity of the material, measured as a compressed powder, is 140 ohm-cm. Elemental analysis indicates that the product is basically a dimaleate salt of the free amine.

EXAMPLE 2

A solution is prepared containing 0.3 g. of the amine of Example 1 and 200 ml. of ether. This solution is filtered into a solution containing 2.5 ml. of dichloroacetic acid dissolved in 50 ml. of ether. A blue-green precipitate forms and is separated by filtration, washed with a solution containing 3 ml. of dichloroacetic acid in 80 ml. of ether, and dried at room temperature. The volume resistivity of the dichloroacetate salt of the amine, measured as a compressed powder, is 8500 ohm-cm.

EXAMPLE 3

A solution is prepared containing 0.05 g. of the amine of Example 1 and 50 ml. of ether. This solution is filtered into a solution containing an excess of trifluoroacetic acid in 50 ml. of ether. An olive-green precipitate is formed and separated by filtration, followed by washing with 70 ml. of ether, and drying at room temperature. The volume resistivity of the trifluoroacetate salt of the amine, measured as a compressed powder, is 7800 ohm-cm.

EXAMPLE 4

A solution is prepared containing 0.05 g. of the amine of Example 1 and 50 ml. of ether. This solution is filtered into a second solution containing 0.03 g. of phthalic acid and 50 ml. of ether. A dark green precipitate is formed and separated by filtration, followed by washing with 70 ml. of ether and drying at room temperature. The volume resistivity of the phthalate salt of the amine, measured as a compressed powder, is $3.5 \times 10^4$ ohm-cm.

EXAMPLE 5

A solution is prepared containing 0.05 g. of the maleate amine salt of Example 1, 1.0 ml. of a 2% solution of poly(vinyl acetate) in methanol, and 40 ml. of methanol with stirring for 5 minutes. The solution is filtered and coated on polyethylene terephthalate film support and dried at room temperature. The surface resistivity of the coating is measured in air by applying painted graphite electrodes on the surface of the film and measuring the resistance with an electrometer. The term "surface" or "thin film" resistivity denotes the electrical resistance of a square of a thin film of material, measured in the plane of the material between opposite sides. For films which obey Ohm's low, this is an intrinsic property of the film. If the resistance is measured in ohms, the thin film or surface resistivity is expressed as ohms per square. (R. E. Aitchison, Aust. J. Appl. Sci., 5, 10 (1954). The resistivity of the coating is $4.1 \times 10^7$ ohm/square, and this value is substantially unchanged when measured in high vacuum.

EXAMPLE 6

The dihydrobromide salt of amine 4 of Table I is prepared using the method of Willstatter et al (supra p. 2682), but using hydrobromic acid instead of hydrochloric acid and using acetone instead of a mixture of ethanol and chloroform. A solution is prepared containing 0.05 g. of this salt, 1.0 ml. of a 2% solution of poly(vinyl acetate) in methanol, and 25 ml. of methanol with stirring for 5 minutes. The solution is filtered and coated on polyethylene terephthalate film support. The coating is dried at room temperature, cured for 3 minutes at 100° C, and the surface resistivity of the coating is measured and found to be $2.2 \times 10^8$ ohm/square.

EXAMPLE 7

A solution is prepared containing 0.08 g. of the amine salt formed by the reaction of hydrobromic acid with the amine 3 of Table I, 5 ml. of a 2% solution of poly(vinyl acetate) in methanol, and 15 ml. of methanol by stirring for 5 minutes. The filtered solution is coated onto a poly(ethylene terephthlate) film support, dried at room temperature and the surface resistivity of the coating measured for resistivity which is found to be $6.3 \times 10^9$ ohm/square.

EXAMPLE 8

A solution is prepared containing 0.05 g. of the amine salt formed by the reaction of sulfuric acid with the amine 2 of Table I, 1.0 ml. of a 2% solution of poly(vinyl acetate) in methanol, and 30 ml. of methanol with stirring for 5 minutes followed by filtering. The filtered solution is coated on poly(ethylene terephthalate) film support, dried at room temperature and cured for 3 minutes at 120° C. The surface resistivity of the coating, measured as in Example 5 is $2.4 \times 10^7$ ohm/square.

EXAMPLE 9

A solution is prepared by stirring 0.05 g. of the amine salt formed by the reaction of hydrochloric acid with the amine 5 of Table I, and 9.5 ml. of methanol for 10 minutes. Then 0.5 ml. of a 2% solution of poly(vinyl acetate) in acetone is added with stirring followed by filtering. The filtered solution is coated on poly(ethylene terephthalate) film support and dried at room temperature. Surface resistivity of the coating is $4.3 \times 10^7$ ohm/square. After overnight exposure to high vacuum, the resistivity is $1.1 \times 10^7$ ohm/square when measured in high vacuum.

EXAMPLE 10

A solution is prepared containing 0.20 g. of the amine salt formed by the reaction of p-toluenesulfonic acid with the amine 15 of Table I in a mixed solvent containing 16 ml. of methanol, 14 ml. of ethanol, 0.8 ml. of n-butanol, and 0.14 g. of poly(vinyl butyral), by stirring for 75 minutes. The filtered solution is coated on poly(ethylene terephthalate) film support and dried at room temperature. The surface resistivity of the coating is $1.8 \times 10^8$ ohm/square.

EXAMPLE 11

When the object is to prepare a semiconductor element coating, it is often advantageous to prepare the semiconductive composition by including the amine and the acid in appropriate amounts in the coating solution. This eliminates the need to isolate the semiconducting amine salt prior to preparing the coating solution. This process is illustrated by the following example. In a solution containing 25.4 ml. of ethanol and 11.0 ml. of methanol, 0.22 g. of poly(vinyl butyral) is dissolved. To this solution is added 0.18 g. of the amine 15 of Table I and 10.6 ml. of a 1% solution (w/vol) of maleic acid in absolute ethanol, and the mixture is stirred for 20 minutes. The filtered solution is coated on poly(ethylene terephthalate) film support, dried at room temperature, and cured for 45 seconds at 100° C. The surface resistivity of the coating is $1.0 \times 10^9$ ohm/square.

EXAMPLE 12

Emeraldine is prepared, purified, and isolated as the hydrochloride using the techniques described generally by R. Willstatter (supra). A coating solution is prepared by stirring 0.05 g. of emeraldine hydrochloride in 20 ml. of methanol for 10 minutes, then adding 1.0 ml. of a 2% solution of alcohol-soluble cellulose acetate butyrate polymer in methanol containing 6.5% n-propanol. The solution is filtered, coated by pouring a small amount on polyester film support and dried at room temperature. The resultant coating has a surface resistivity of $8.3 \times 10^8$ ohm/square when measured as in the preceding examples. After exposure to a high vacuum overnight, the coating has a resistivity of $1.9 \times 10^9$ ohm/square when measured in a high vacuum.

EXAMPLE 13

A solution is prepared containing 0.04 g of the amine salt formed by the reaction of hydrobromic acid with the amine 2 of Table I and 0.06 g of poly(vinyl formal) in a mixed solvent containing 9.3 ml. of methanol, 6.4 ml. of 1,2-dichloroethane, and 3.0 ml. of 2-methoxyethanol, by stirring for 1 hour. The filtered solution is coated on poly(ethylene terephthalate) film support, dried at room temperature and cured for 45 seconds at 100° C. The resulting clear coating has a surface resistivity of $4.4 \times 10^6$ ohm/square. The conducting coating is subsequently overcoated with a protective layer of a terpolymer of vinylidene chloride, methyl acrylate and itaconic acid, applied from a 2.5% solution (w/vol) in methyl isobutyl ketone. The surface resistivity of the resulting two-layer coated system is $1.4 \times 10^7$ ohm/square.

EXAMPLE 14

A solution is prepared containing 0.20 g of the amine salt of Example 13 and 0.12 g of poly(vinyl formal) in a solvent mixture containing 42 ml of ethanol, 16.2 ml of 1,2-dichloropropane, 9.8 ml of 1,1,2-trichloroethane, and 7.2 ml of 2-methoxyethanol. The filtered solution is coated on cellulose acetate film support, dried at 35° C, and cured for 45 seconds at 100° C. The conducting coating, is then overcoated with a layer of clear polymer comprising a terpolymer of methyl acrylate, vinylidene chloride and itaconic acid from a 2.5% solution (w/vol) in methyl isobutyl ketone. This layer is dried at room temperature and cured for 1.5 min at 60° C. The resistivity of the two-layer coated system is $2.8 \times 10^8$ ohm/square. A gelatin sub and a gelatino-silver halide photographic emulsion are then coated in sequence above the layer of clear polymer to provide a static-free photographic element. The multilayer photographic element shows satisfactory sensitometric properties, thus demonstrating the efficacy of the clear polymer layer in preventing unwanted changes in the light sensitivity of the emulsion resulting from any action of constituents of the conducting layer.

EXAMPLE 15

A solution is prepared containing 0.60 g of the amine 2 of Table I and 0.48 g of poly(vinyl formal) in a mixed solvent comprising 145 ml of ethanol, 64 ml of 1,2-dichloropropane, 40 ml of 1,1,2-trichloroethane, and 29 ml of 2-methoxy ethanol. To this solution is added 23 ml of an ethanol solution containing 1 g. of aqueous hydrobromic acid (48%) in 59 ml of ethanol. The filtered solution is coated on cellulose acetate film support, dried at 50° C, and cured for 40 seconds at 100° C. The resulting conducting coating is overcoated with a layer of clear polymer from a 5% solution (w/vol) of poly(methyl methacrylate) in 1,2-dichloropropane. This layer is also dried at 50° C and cured at 100° C. The two-layer coated element has a resistivity of $2 \times 10^9$ ohm/square, which is unchanged when the coated element is subjected to typical black-and-white or color film processing sequences commonly used in photography. The two-layer coated element shows excellent antistatic properties in conjunction with a gelatinosilver halide photographic emulsion coated on the opposite side of the film support. In addition, the two-layer coated element produces no adverse effects when pressed in intimate contact with a typical photographic emulsion. The two-layer coated element also shows good abrasion resistance and adhesion of the coated layers. These tests establish the effectiveness of the two-layer coated element as a permanent, antistatic backing for photographic films. The photographic emulsion may also be coated on the same side of the film support as the two-layer coated element, as in Example 14.

EXAMPLE 16

A solution is prepared containing 0.113 g of the amine salt of Example 13, 1.85 ml of a 5% solution (w/vol) of a copolymer of methyl methacrylate and methacrylic acid in methanol, 12.6 ml of methanol and 0.6 ml of 2-methoxyethanol, by stirring for 45 minutes. The filtered solution is coated on poly(ethylene terephthalate) film support, dried at 50° C, and cured for 45 seconds at 60° C. The surface resistivity of the coating is $3.2 \times 10^6$ ohm/square. A layer of clear polymer is then applied above the conducting layer, comprising a terpolymer of acrylonitrile, vinylidene chloride and acrylic acid coated from a 2.5% solution (w/vol) in methyl isobutyl ketone. This layer is dried at 47° C and cured for 1.5 min at 100° C. A photoconductive layer, comprising an organic photoconductor in a polycarbonate binder, is coated above the barrier layer using chlorinated solvents. This layer has a wet thickness of 0.004 inch, is dried for 3 minutes at 52° C, and cured at 95° C for 3 minutes. The resistivity of the conducting layer in the three-layer sandwich is $6.3 \times 10^7$ ohm/- square. It serves as an effective conductive layer in an electrophotographic element comprising a photoconductive layer, a conductive layer and an insulating support.

EXAMPLE 17

A coating of the amine salt formed by the reaction of hydrobromic acid with the amine 5 of Table I is prepared on a poly(ethylene terephthalate) film support as in Example 9. The surface resistivity is measured as in Example 5 and found to be $1.5 \times 10^7$ ohm/square at room temperature. Measured in a high vacuum, the surface resistivity is $1.7 \times 10^7$ ohm/square. A potential of 47 volts d.c. is applied to a strip of the coating by making contact through graphite electrodes painted on the surface leaving an uncoated area approximately $1.9 \times 1.9$ cm. square between the electrodes. Direct current is allowed to flow continuously for 7 days while the high vacuum is maintained (pressure $< 1 \times 10^{5}$-mm Hg). At the end of this time, the resistivity of the coating is $2.0 \times 10^7$ ohm/square. From the geometry and physical properties of the coating, it is calculated that the total electric charge (1.53 coulombs) which has passed through the coating is 320 times greater than that which could be carried by all the ions under one electrode. This is conclusive evidence that the conductivity is at least 99.7% due to the migration of electrons and/or positive holes and not due to ionic migration.

This behavior of a typical coating containing an organic semiconductor of the type described in this invention contrasts markedly with that of the usual amine salts or quaternary ammonium salts in which conduction, if it occurs at all, is by the motion of ions in the presence of absorbed moisture. In such cases, a decrease in the moisture content (by reducing the relative humidity of the air) produces a substantial decrease in the conductivity, and at low relative humidity, or in a high vacuum, such materials do not have useful electrically conductive properties and would be classified as insulators.

EXAMPLE 18

The following compounds are prepared in a manner similar to that previously described and measured for volume resistivity as in Example 1. The results obtained are shown in Table II below.

Table II

Structure and Resistivity of Typical Semiconducting Amine Salts

| Designation | Amine Salt | Resistivity, ohm-cm |
|---|---|---|
| I | [⬡-NH-⬡-N=⬡=O] H$_2$SO$_4$ | 320 |
| II | [⬡-NH-⬡-NH-⬡-N=⬡=O] H$_2$SO$_4$ | 420 |
| III | [⬡-NH-⬡-N=⬡=N-⬡-NH$_2$] HF | 260 |
| IV | [⬡-NH-⬡-N=⬡=N-⬡-NH$_2$] HNO$_3$ | 1,800 |
| V | [⬡-N=⬡=N-⬡-N=⬡=NH] 2HBr | 3,600 |
| VI | [NH$_2$-⬡-NH-⬡-N=⬡=N-⬡-NH$_2$] 2.8 HCl | 1,500 |
| VII | [⬡-NH-⬡-NH-⬡-NH-⬡-N=⬡=N-⬡-N=⬡=N-⬡-NH$_2$] × HCl | 2,900 |

EXAMPLE 19

A solution of 0.5 g. of amine 3 of Table I in 50 ml. of acetone is added with stirring to a solution of 0.5 g. of a 1:1 copolymer of ethylene and maleic acid dissolved in a solvent mixture containing 30 ml. of acetone and 20 ml. of methanol. To the resulting dark greeen solution, 300 ml. of ethyl ether is added to precipitate the polymeric amine salt. The solid salt is removed from the solution by filtration and dried in vacuum. The volume resistivity of the material, measured as a compressed powder, is $2 \times 10^6$ ohm/cm.

EXAMPLE 20

The reaction mixture of Example 19 containing the dissolved polymeric semiconducting amine salt, is alternately coated onto a poly(ethylene teerephthalate) film support, without isolating the solid semiconductor, and the coating is dried. The resultant coating has a surface resistivity of $1.8 \times 10^{10}$ ohm/square when measured as in Example 5. After exposure to a high vacuum overnight, the coating has a resistivity of $1.9 \times 10^{10}$ ohm square when measured in high vacuum.

The invention has been described in detail with particular reference to certain preferred embodiments, thereof, but it will be understood that variations and modifications can be effected within the spirit and scope of the invention.

I claim:

1. A semiconductor element comprising a support having thereon a photoconductive layer and a semiconductor composition comprising a binder and a semiconductor having organic solvent solubility and represented by the expression:

$$D[A]_q$$

wherein:
D represents a moiety having the structure:

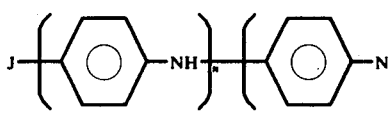

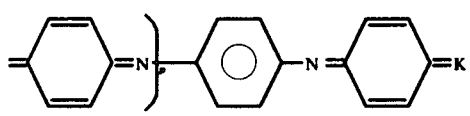

in which
J represents either $R_1$ or a group having the formula

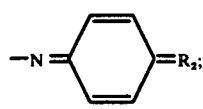

K represents either $R_3$ or a group having the formula

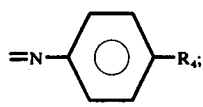

$R_1$ and $R_4$ are each selected from the group consisting of a hydrogen atom, a hydroxy radical, a lower alkyl radical, a lower alkoxy radical, an amino radical, an aryl radical, an acyl radical, a carboxylate radical, a thio radical, a nitrate radical, a sulfonate radical, a halogen atom and a cyano radical;
$R_2$ and $R_3$ each represent (1) an uncharged radical selected from the group consisting of oxo, imino and thioxo radicals or (2) a charged radical selected from the group consisting of alkoxonium, iminium, and sulfonium radicals; and
n and p are each integers having the following combination of values:

| | |
|---|---|
| when J represents —N=⟨⟩=R₂ and K represents R₃, | p=0, n=0,1,2,3,4,5<br>p=1 n=0,1,2,3<br>p=2 n=0,1 |
| when J represents $R_1$ and K represents R₃, | p=0 n=0,1,2,3,4,5,6<br>p=1 n=0,1,2,3,4<br>p=2 n=0;1,2<br>p=3 n=0 |
| when J represents $R_1$ and K represents =N—⟨⟩—R₄, | p=0 n=0,1,2,3,4,5<br>p=1 n=0,1,2,3<br>p=2 n=0,1 |

A is an acid when $R_2$ and $R_3$ are each an uncharged radical and when $R_2$ and $R_3$ is a charged radical, A is an anion derived from an acid; and
q represents the number of A moieties associated with each D is a positive integer that is greater than 0 and less than or equal to the number of amine groups in the D moiety.

2. A semiconductor element as described in claim 1, wherein the semiconductor has organic solvent solubility and is represented by the expression:

$$D[A]_q$$

wherein:
D represents a moiety having the structure:

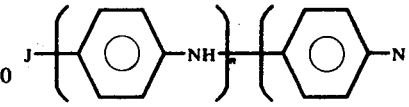

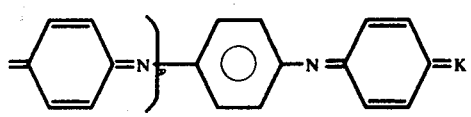

in which:
J represents either $R_1$ or a group having the formula

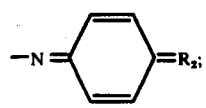

K represents either $R_3$ or a group having the formula

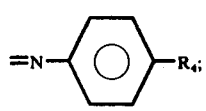

$R_1$ and $R_4$ are each selected from the group consisting of a hydrogen atom, a hydroxy radical, a lower alkyl radical, a lower alkoxy radical, an amino radical, an aryl radical, an acyl radical, a carboxylate radical, a thio radical, a nitrate radical, a sulfonate radical, a halogen atom and a cyano radical;
$R_2$ and $R_3$ each represent (1) an uncharged radical selected from the group consisting of oxo, imino and thioxo radicals or (2) a charged radical selected from the group consisting of alkoxonium, iminium, and sulfonium radicals; and
n and p are each integers having the following combinations of values:

| | | |
|---|---|---|
| when J represents —N=⟨⟩=R₂ and K represents R₃, | p=0 | n=0, 1, 2, 3 |
| when J represents $R_1$ and K represents R₃ | p=0<br>p=1 | n=0, 1, 2<br>n=0, 1 |
| when J represents $R_1$ and K represents =N—⟨⟩—R₄, | p=0 | n=0, 1, 2 |

-continued

| |
|---|
| p = 1   n = 0; |

A is an acid when $R_2$ and $R_3$ are each an uncharged radical and when $R_2$ and/or $R_3$ is a charged radical, A is an anion derived from an acid; and q represents the number of A moieties associated with each D and is a positive integer that is greater than 0 and less than or equal to the number of amine groups in the D moiety.

3. A semiconductor element as described in claim 1 wherein the moiety A is selected from the group consisting of an inorganic acid, an organic acid and an acidic polymer.

4. A semiconductor element as described in claim 1, wherein the semiconductor is an amine salt of a member selected from sulfuric acid, hydrobromic acid, fluoboric acid, benzoic acid p-toluic or p-toluenesulfonic acid together with a member selected from the group consisting of N-{p-[4-(p-methoxy anilino) anilino]phenyl}-1,4-benzoquinone imine, N-[p-(1,4-benzoquinone diimino) phenyl]-N'-phenyl-1,4-benzoquinone diimine, N-(p-anilinophenyl)-N'-(p-aminophenyl)-1,4-benzoquinone diimine, and N-[p-(4-anilino)-anilinophenyl]-1,4-benzoquinone imine.

5. A semiconductor element as described in claim 1, and also comprising a protective layer between said photoconductor layer and said semiconductor composition.

* * * * *